United States Patent
Hertwig et al.

(10) Patent No.: US 9,231,363 B1
(45) Date of Patent: Jan. 5, 2016

(54) OPTICAL PUMPING APPARATUS FOR SLAB LASERS AND AMPLIFIERS

(71) Applicant: Coherent, Inc., Santa Clara, CA (US)

(72) Inventors: Michael Hertwig, San Ramon, CA (US); Sergei Govorkov, Los Altos, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 14/620,949

(22) Filed: Feb. 12, 2015

(51) Int. Cl.
| | |
|---|---|
| H01S 3/094 | (2006.01) |
| H01S 3/16 | (2006.01) |
| H01S 5/40 | (2006.01) |
| H01S 3/0941 | (2006.01) |
| H01S 3/06 | (2006.01) |
| H01S 3/042 | (2006.01) |
| H01S 5/10 | (2006.01) |
| H01S 3/08 | (2006.01) |

(52) U.S. Cl.
CPC ......... *H01S 3/094057* (2013.01); *H01S 3/0941* (2013.01); *H01S 5/4025* (2013.01); *H01S 3/042* (2013.01); *H01S 3/0606* (2013.01); *H01S 3/08059* (2013.01); *H01S 3/1611* (2013.01); *H01S 3/1671* (2013.01); *H01S 5/1014* (2013.01)

(58) Field of Classification Search
CPC ................... H01S 3/094057; H01S 3/094049; H01S 3/093; H01S 5/1014
See application file for complete search history.

(56) References Cited

U.S. PATENT DOCUMENTS

| | | | | |
|---|---|---|---|---|
| 6,049,558 A | * | 4/2000 | Harada | H01S 3/09415 372/103 |
| 6,151,342 A | | 11/2000 | Nightingale et al. | |
| 6,288,833 B1 | * | 9/2001 | Kasamatsu | H01S 3/063 359/333 |
| 7,256,931 B2 | | 8/2007 | Damzen | |
| 2003/0206570 A1 | * | 11/2003 | Henrie | H01S 3/0941 372/99 |
| 2008/0025362 A1 | * | 1/2008 | Yamamoto | H01S 3/0941 372/75 |
| 2013/0194673 A1 | * | 8/2013 | Vetter | G02B 27/09 359/618 |

* cited by examiner

*Primary Examiner* — Tod T Van Roy
*Assistant Examiner* — Marcia Golub-Miller
(74) *Attorney, Agent, or Firm* — Morrison & Foerster LLP

(57) ABSTRACT

An optical amplifier includes a solid state gain-element. The gain-element is pumped by pump-radiation from a diode-laser bar. The diode-laser radiation is delivered from the diode-laser bar to the gain-element entirely via a tapered light-guide which guides the radiation only in a fast-axis direction of the diode laser bar. The tapering of the light-guide reduces fast-axis divergence of the pump-radiation by about a factor of ten. The pump-radiation is delivered to the gain-element as a line of radiation homogenized in the fast-axis direction.

17 Claims, 5 Drawing Sheets

OPTICAL PUMPING APPARATUS FOR SLAB LASERS AND AMPLIFIERS

TECHNICAL FIELD OF THE INVENTION

The present invention relates in general to optical pumping of solid-state lasers and amplifiers. The invention relates in particular to pumping such lasers and amplifiers with laser-radiation from a diode-laser bar.

DISCUSSION OF BACKGROUND ART

One particularly effective optical amplifier is described in U.S. Pat. No. 7,256,931. This amplifier includes a slab-type gain-element of a highly doped gain-medium such as neodymium-doped yttrium vanadate (Nd:YVO$_4$). The gain-element is energized by laser-radiation from a linear array of diode-lasers (semiconductor-lasers) commonly referred to by practitioners of the laser art as a diode-laser bar.

Diode-lasers in a diode-laser bar have emitters characterized as having a fast-axis, in which radiation is emitted with a relatively high divergence (for example up to about 35° half-angle), and a slow-axis in which radiation is emitted with relatively low divergence (for example, less than about 10° half-angle). The emitters are aligned, spaced apart, in the slow-axis direction. Typically, a diode-laser bar has a length of about 10 millimeters (mm) and width between about 1 and 2 mm. Emitter apertures have a slow-axis dimension of up to about 100 micrometers (μm) and a fast-axis dimension of about 1 μm. One preferred number of emitters per bar is 19.

In an optical pumping arrangement for a conventional slab-amplifier, radiation from the diode-laser bar is collimated in the fast-axis by a first, elongated, cylindrical lens referred to as a fast-axis collimating (FAC) lens. The fast-axis collimated radiation is then focused by a second cylindrical lens into a lateral surface of the gain-element. The radiation is primarily absorbed close to the lateral face to form a narrow, shallow, nominally linear gain-region at that lateral face.

A beam of radiation to be amplified is directed into the gain-element through a first end-face thereof into the linear gain-region at a first location such that the radiation is incident at grazing incidence, for example at an incidence-angle of about 80°. The radiation is reflected by total internal reflection (TIR) out of the gain-element through an opposite second end-face thereof. That radiation is then directed by a pair of mirrors back into the gain-element through the second end-face back into the linear-gain region, again at grazing incidence, but at a second location spaced apart from the first location. TIR directs the twice-incident (amplified) radiation out of the gain-element through the first end-face thereof.

Emitting apertures in a diode-laser bar are rarely exactly fast-axis aligned. Misalignment in the fast axis direction can occur in particularly when the diode-laser bar is mounted on a heat sink. This fast-axis misalignment, which can be as much as 20 μm, is whimsically referred to by practitioners of the art as "smile". This presents a problem in the above-discussed optical pumping arrangement inasmuch as any smile in a diode-laser bar will be reproduced and magnified by the collimating and focusing lenses in the nominally linear gain-region of the gain-element. This can result in inefficiency or inconsistency of the amplifier gain.

If such inconsistency and inefficiency cannot be tolerated, diode-laser bars having tolerably low smile can be selected from a batch of mounted diode-laser bars. This of course can result in low yield and consequently higher cost for the selected mounted bars. There is a need for an optical pumping arrangement which is insensitive to smile in a diode-laser bar.

SUMMARY OF THE INVENTION

In one aspect, optical apparatus in accordance with the present invention comprises a gain-element and a diode-laser bar for providing pump-radiation for energizing the gain-element. The pump-radiation is delivered from the diode-laser bar in a propagation-direction with a transverse slow-axis parallel to the length of the diode-laser bar and a fast-axis perpendicular to the slow-axis. The pump-radiation is delivered from the diode-laser bar to the gain-element by transporting the radiation in a tapered light-guide. The light-guide guides the pump-radiation in the fast axis direction only and is tapered in the fast-axis direction, with a fast-axis height of the light-guide increasing progressively in the propagation direction.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
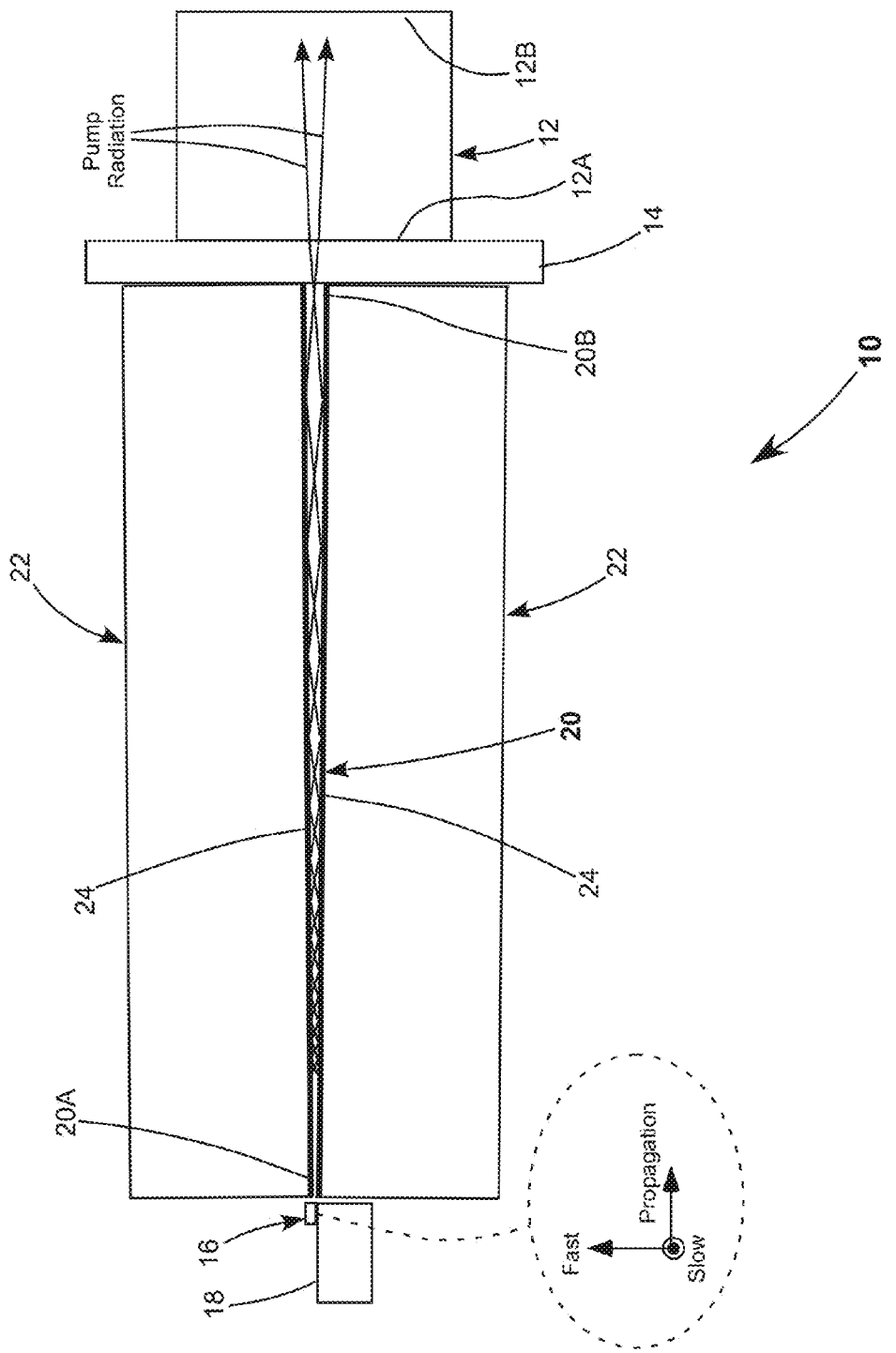
FIG. 1 is an elevation view schematically illustrating a preferred embodiment of optical amplifier apparatus in accordance with the present invention, including a diode-laser bar mounted on a copper heat-sink, a solid-state gain-element, and a tapered light-guide formed by a pair of mirror-coated plates, and arranged to guide pump-radiation from the diode-laser bar through a sapphire heat sink into the gain-element, while reducing fast-axis divergence of the radiation.
Figure 1A:
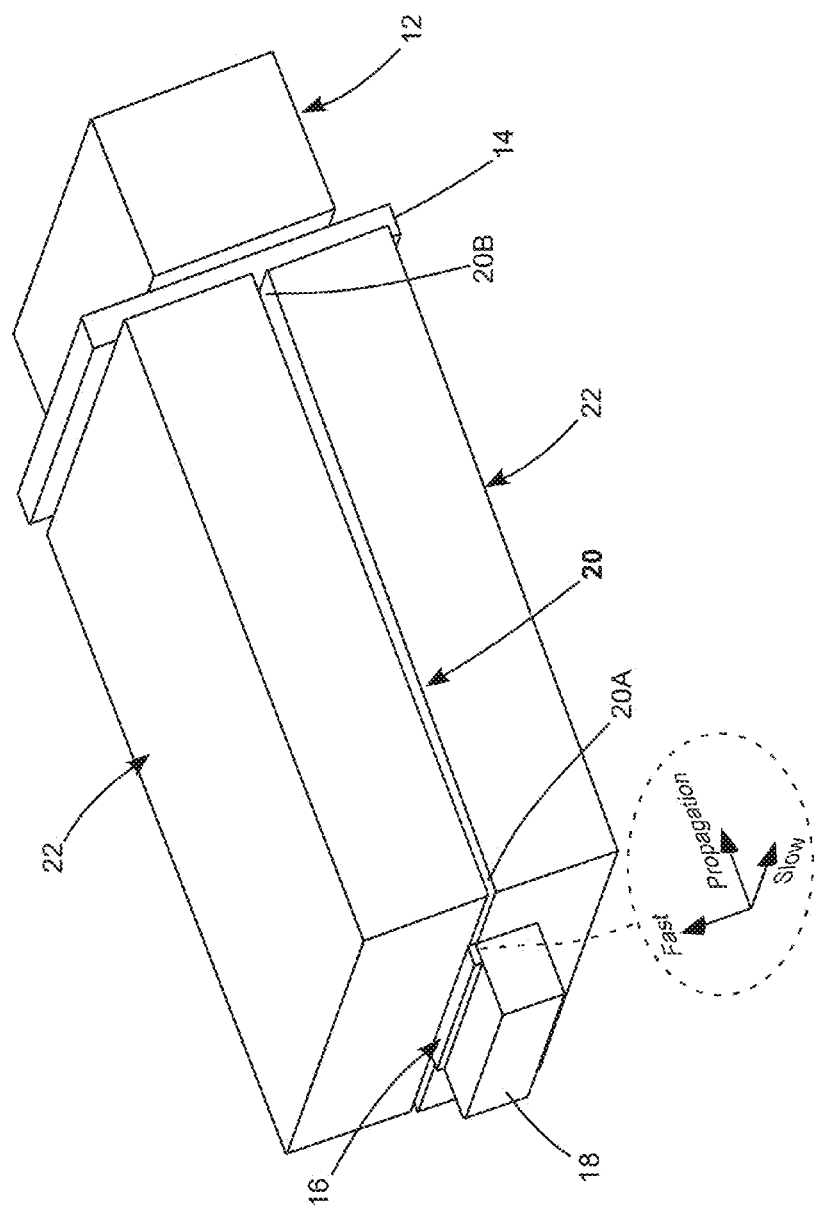
FIG. 1A is a three-dimensional view schematically illustrating further detail of the diode-laser bar, light-guide, sapphire heat-sink, and gain-element in the apparatus of FIG. 1.

Turning now to the drawings, wherein like features are indicated by like reference numerals, FIG. 1 and FIG. 1A schematically illustrate a preferred embodiment 10 of optical amplifier apparatus in accordance with the present invention. Apparatus 10 includes a gain-element 12 in a slab or parallelepiped form. One preferred material for gain-element 12 is Nd:YVO$_4$, which has a peak-gain wavelength of about 1064 nanometers (nm). A lateral face 12A of gain-element 12 is in thermal contact with a heat-sink 14 of a highly thermally conductive, optically transparent material, such as sapphire, diamond, or silicon carbide.

Optical pump-radiation (pump-radiation) for energizing the gain-element is provided by a diode-laser bar (linear diode-laser array) 16 in thermal communication with a heat-sink 18. The fast-axis, slow-axis, and propagation-axis of the bar are indicated. A tapered light-guide 20 conveys pump-radiation from diode-laser bar 16 to gain-element. Light-guide 20 is formed by mirror coated surfaces 24 of parallel-sided plates 22.

The light-guide is tapered only in the fast-axis direction of the diode laser-bar. The fast-axis height of the light-guide in the slow axis direction is uniform at any point along the propagation-axis. Light-guide 20 has a minimum height at proximal end 20A thereon. The height increases linearly to a maximum height at distal end 20B of the light-guide. This provides that the fast-axis divergence of radiation from the laser is progressively reduced with distance propagated in the light-guide, as indicated in the drawing of FIG. 1 by multiple reflections of the fast-axis extreme rays of the beam. In FIG. 1 the light-guide is nearly to scale and the extreme rays are reproduced from an actual ray trace. The total fast-axis divergence is reduced by the taper-angle at each of the multiple reflections.

The fast-axis height of light-guide 20 at proximal end 20A thereof is selected dependent on the spacing of the light-guide from the diode-laser bar 18, the fast-axis divergence of the beam, and the maximum anticipated smile of a diode-laser bar, such that all radiation from the diode-laser bar enters the light-guide. Light-guide 20 guides radiation only in the fast-axis direction and the slow-axis beam width increases progressively with propagation distance consistent with the slow-axis divergence of the pump-radiation. Because of this, in this parallel-plate realization of light-guide 20, the (slow-axis) width of plates 22 is selected such that the beam is still completely fast-axis guided at distal end 20B of light-guide 20, and all of the radiation from the diode-laser bar, less ordinary reflection losses, reaches gain-element 12.

In one example of light-guide 20 the light-guide is tapered from a fast-axis height of 38 μm at proximal end 20A to a fast-axis height of 203 μm. The length of the light-guide was 15 mm. This reduced the fast-axis output-divergence to about one-fifth of the fast-axis input-divergence.

Figure 1C:
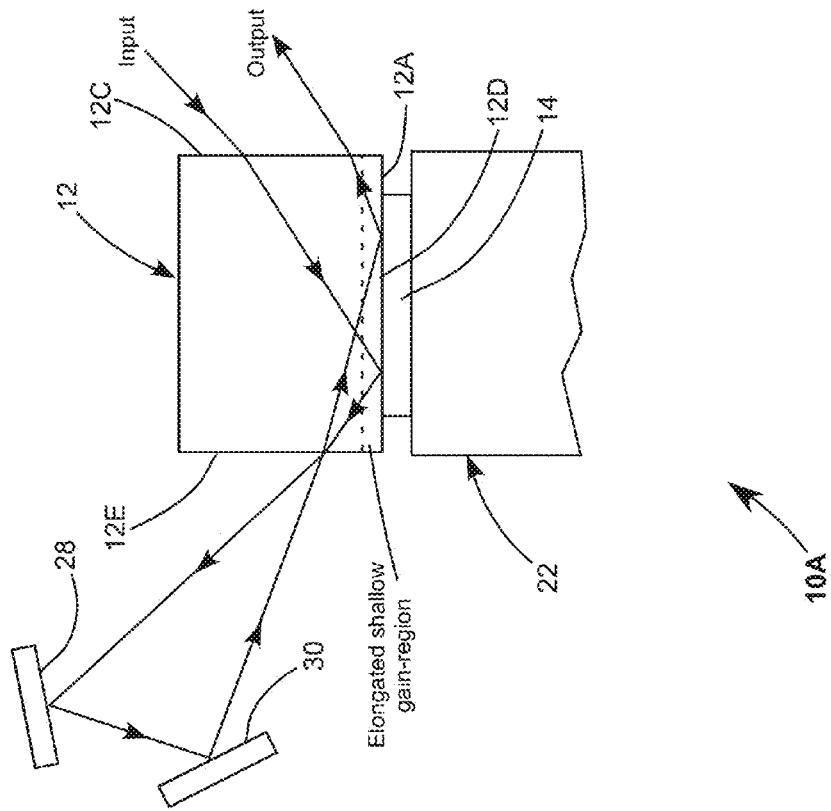
FIG. 1C is a fragmentary plan-view schematically illustrating laser-radiation to be amplified interacting with the pump-radiation in a double pass through the gain-element of FIG. 1.
Figure 1B:
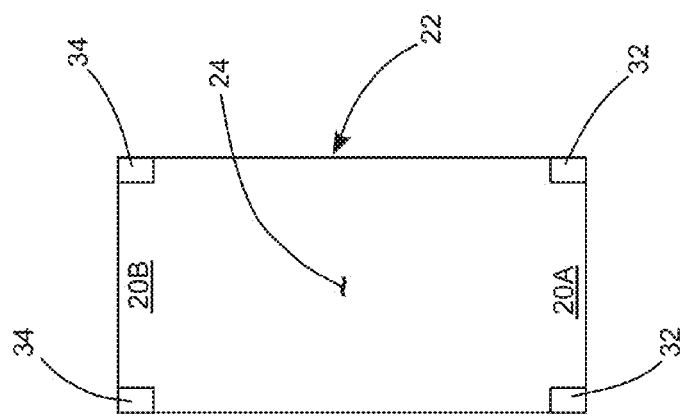
FIG. 1B is a plan-view schematically illustrating a method of forming the light-guide of FIGS. 1 and 1A.

FIG. 1B schematically illustrates one preferred method for assembling light-guide 20 from plates 22. Surfaces 24 of the plates are polished and optically coated. The surface figure is not critical, and can be up to about 5-waves ($5\lambda$). The coating is preferably a dielectric-enhanced silver coating having a reflectivity of at least about 97% over a relatively broad bandwidth, for example greater than one-third of an octave, about the pump-radiation wavelength.

While the pump-radiation can be considered to be essentially monochromatic, the broad bandwidth is required to accommodate the wide range of incidence angles in the light-guide for the fast-axis guided pump-radiation. As the reflection spectrum of the coating shifts to shorter wavelengths with increasing angle of incidence, the diode laser wavelength should be at the short wavelength end of the spectrum measured at the lowest anticipated angle of incidence.

On one of the polished and coated plates, precision shims 32 having a thickness corresponding to a desired proximal-end height are placed at corners of the plate at proximal end 20A, of the light-guide. Similarly, precision shims 34 having a thickness corresponding to a desired distal-end height are placed at corners of the plate at distal end 20B, of the light-guide. The second plate 22 can then be placed over the first-plate supported by the four shims 32 and 34 and the plates clamped or bonded together to form the light-guide. Suitable shim stock is available as stainless steel shim stock from McMaster-Carr of Elmhurst, Ill.

The above-described light-guide assembly method is just one exemplary method by which the light-guide may be fabricated. Those skilled in the art may devise other methods of fabricating a tapered light-guide of comparable performance without departing from the spirit and scope of the present invention.

FIG. 1C schematically illustrates a version 10A of apparatus 10 configured as a double-pass, grazing-incidence optical amplifier. Gain-element 12 is heavily doped such that most of the line of pump-radiation is confined close to surface 12A thereby providing a narrow, shallow, linear gain-region in gain element 12. Input radiation to be amplified is directed into the gain-region through surface 12C of the gain element; is reflected by TIR from surface 12A; and exits the gain-element through surface 12E thereof. The radiation is then steered back into the gain-region by mirrors 28 and 30, and is reflected by TIR out of the gain-element as output radiation.

Only sufficient details of grazing-incidence amplifier 10A are provided for understanding principles of the present invention. A detailed description of the grazing-incidence amplifier principle is provided in above-referenced U.S. Pat. No. 7,256,931, assigned to the assignee of the present invention, and the complete disclosure of which is hereby incorporated herein by reference.

Those skilled in the art will recognize, without further detailed description or illustration, that the arrangement of FIG. 1C could be reconfigured as a laser (oscillator) by providing feedback mirrors for the input and output beams. Another well-known laser type suitable for optical pumping with a line of radiation in accordance with the present invention is a so-called INNOSLAB laser. In this type of laser, a gain-element having a narrow, shallow linear gain-region is included in a hybrid laser-resonator which is an unstable resonator in a first transverse-axis aligned with the linear gain-region. and stable in a second transverse-axis perpendicular to the first transverse-axis. Those skilled in the art may devise other amplifier and laser arrangements suitable for optical pumping with the above described apparatus without departing from the spirit and scope of the present invention.

Figure 2:
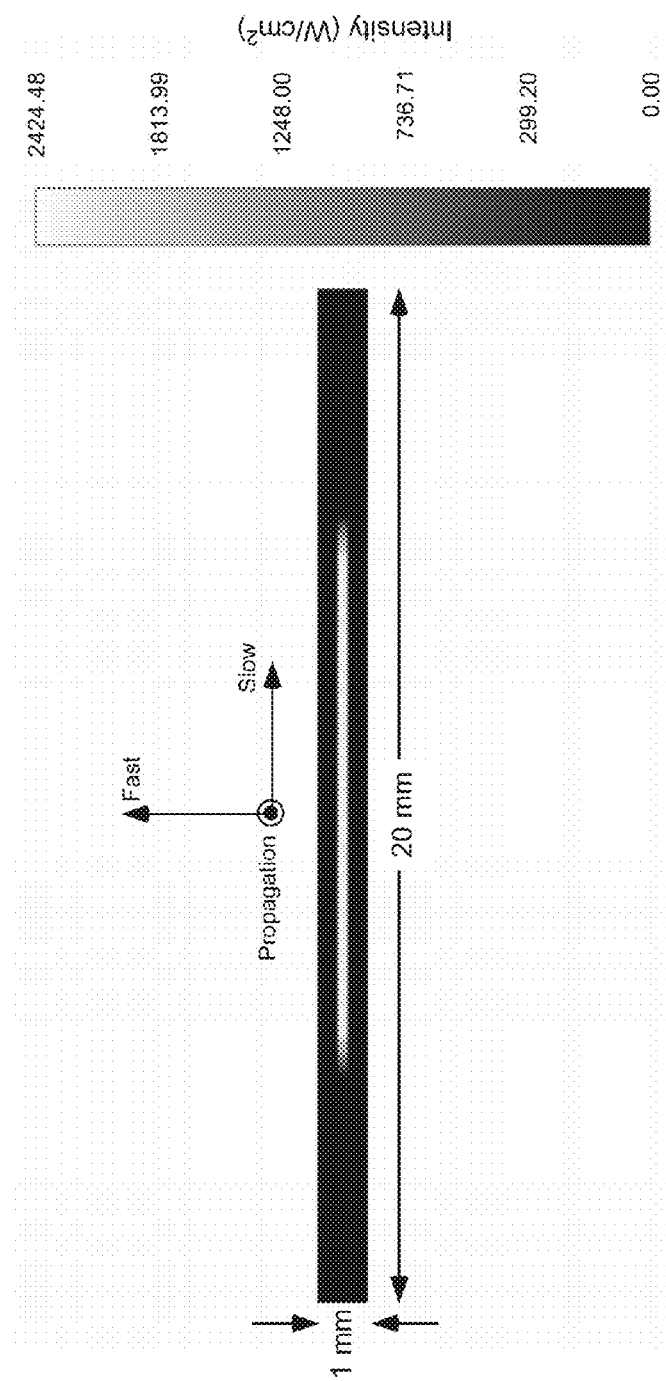
FIG. 2 is a gray-scale diagram schematically illustrating calculated spatial distribution of radiation in a line of radiation delivered by the tapered light-guide of FIG. 1.

The high degree of linearity and homogeneity for a line of pump-radiation delivered by the inventive apparatus can be appreciated from the gray-scale diagram of FIG. 2, which depicts calculated spatial distribution in the line of radiation in the fast- and slow-axes. It can be seen that distribution is very linear, and very uniform, particularly in the fast-axis. This degree of uniformity and linearity is independent of smile in a diode-laser bar. The linearity is limited only by the precision with which light-guide 20 can be assembled.

Figure 3:
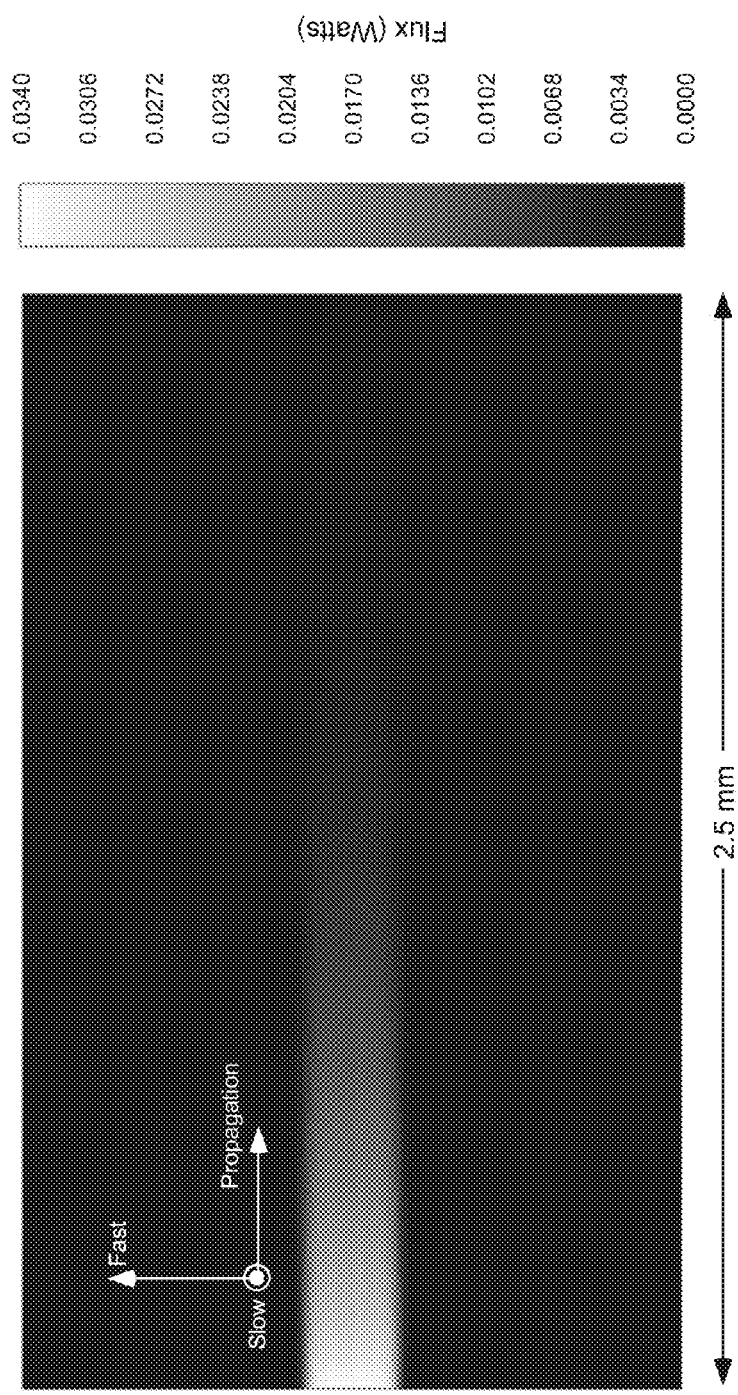
FIG. 3 is a gray-scale diagram schematically illustrating calculated radiation-flux in the gain-element in a direction perpendicular to the line of radiation of FIG. 2.

FIG. 3 is a gray-scale diagram schematically illustrating calculated radiation-flux in the gain-element in a propagation-direction perpendicular to the line of radiation of FIG. 2. The gain-element is assumed to be a Nd:YVO$_4$ crystal with a neodymium-doping percentage of 1 atomic percent. The fast-axis uniformity of the radiation is again evident.

Those skilled in the art will recognize from the description provided above that a particularly advantageous aspect of the present invention is that the high precision of line-of-radiation delivery is achieved without any refractive focusing optics, and can be achieved with slow-axis (smile) misaligned diode-laser bars that would be unusable with prior-art line projection methods for reasons discussed above. This reduces the cost of optics and diode-laser bars. The tapered light-guide is assembled from simple flat plates, which can be polished and coated in bulk, and assembled with a relatively simple mechanical process.

The uniformity of the pump-radiation intensity in the gain-element is critical for obtaining a high spatial quality of the amplified beam. The inventive pumping arrangement is not only simple and cost efficient, but also acts as a pump beam homogenizer that is insensitive to smile, misalignment alignment and the like. With a conventional arrangement involving a fast-axis collimator lens, it is necessary to rely on the quality of the lens, low smile, and alignment which can be inconsistent and accordingly costly to control in a product. \

In summary, the present invention is described above in terms of a preferred and other embodiments. The invention is not limited however to the embodiments described and depicted herein. Rather the invention is limited only to the claims appended hereto.

What is claimed is:

1. An apparatus, comprising:
a gain-element;
a diode-laser bar for providing pump-radiation for energizing the gain-element, the diode-laser bar having a length, and the pump-radiation being delivered from the diode-laser bar in a propagation-direction, with a transverse slow-axis of the pump-radiation parallel to the length of the diode-laser bar and a fast-axis of the pump-radiation perpendicular to the slow-axis; and
wherein the pump-radiation is delivered from the diode-laser bar to the gain-element by transporting the radiation in a tapered light-guide, the light-guide guiding in the fast-axis direction only and being tapered in the fast-axis direction, with a fast-axis height of the light-guide increasing progressively in the propagation direction.

2. The apparatus of claim 1, wherein the tapered light-guide includes first and second plates each thereof having a polished reflective-coated surface, and wherein the polished reflective-coated surfaces are arranged spaced apart and facing each other to form the tapered light-guide.

3. The apparatus of claim 2, wherein the first and second plates are glass plates.

4. The apparatus of claim 2, wherein the reflective coatings are dielectric enhanced silver coatings.

5. The apparatus of claim 1, wherein the gain-element is a neodymium vanadate gain element.

6. The apparatus of claim 1, wherein the pump-radiation is delivered from the diode-laser bar directly to the tapered light-guide, without any intervening optical elements.

7. The apparatus of claim 1, wherein the length of the tapered light-guide is about 15 millimeters, and the fast-axis height of the tapered light-guide increases from about 38 micrometers to about 203 micrometers.

8. The apparatus of claim 1, further including a transparent heat-sink between the tapered-light-guide and the gain-element in thermal contact with the gain-element.

9. The apparatus of claim 8, wherein the transparent heat-sink is made from one of sapphire, diamond, and silicon carbide.

10. An apparatus, comprising:
a gain-element;
a diode-laser bar for providing pump-radiation for energizing the gain-element, the diode-laser bar having a length, and the pump-radiation being delivered from the diode-laser bar with a transverse slow-axis of the pump-radiation parallel to the length of the diode-laser bar and a fast-axis of the pump-radiation perpendicular to the slow-axis, the pump-radiation having a slow-axis divergence and fast-axis divergence greater than the slow-axis divergence; and
a tapered light-guide between the diode-laser bar and the gain-element for delivering pump-radiation from the diode-laser bar to the gain-element, the light-guide being tapered in the fast-axis direction only, and guiding the pump-radiation in the fast-axis only, the tapered light-guide having a first fast-axis height at a proximal end thereof adjacent the diode-laser bar, and a second fast-axis height at a distal end thereof adjacent the gain-element, the second fast-axis height being greater than the first fast-axis height, whereby the pump-radiation is delivered from the tapered light-guide to the gain-element with the fast-axis divergence reduced and the slow-axis divergence unchanged.

11. The apparatus of claim 10, wherein the tapered light-guide includes first and second plates each thereof having a polished reflective-coated surface, and wherein the polished reflective-coated surfaces are arranged spaced apart and facing each other to form the tapered light-guide.

12. The apparatus of claim 11, wherein the first and second plates are glass plates.

13. The apparatus of claim 12, wherein the reflective coatings are dielectric enhanced silver coatings.

14. The apparatus of claim 11, wherein the reflective coatings have a spectral bandwidth greater than or equal to about one-third of an octave.

15. The apparatus of claim 10, further including a transparent heat-sink between the distal end of tapered-light-guide and the gain-element in thermal contact with the gain-element.

16. The apparatus of claim 15, wherein the transparent heat-sink is made from one of sapphire, diamond, and silicon carbide.

17. The apparatus of claim 10, wherein the pump-radiation is delivered from the diode-laser bar directly into the tapered light-guide without any intervening optical elements.

* * * * *